Sept. 15, 1970 I. F. ORRELL, JR 3,529,179

LOGIC NOISE SUPPRESSOR

Filed Nov. 1, 1967

Irving F. Orrell, Jr.
INVENTOR.

BY Harry M. Saragovitz
Edward J. Kelly
Herbert Berl
James T. Deaton

United States Patent Office 3,529,179

Patented Sept. 15, 1970

3,529,179

LOGIC NOISE SUPPRESSOR

Irving F. Orrell, Jr., Whitinsville, Mass., assignor, by mesne assignments, to the United States of America as represented by the Secretary of the Army Filed Nov. 1, 1967, Ser. No. 679,937
Int. Cl. H03k *5/08*
U.S. Cl. 307—237 1 Claim

ABSTRACT OF THE DISCLOSURE

A logic circuit having a number of diodes serially connected between an input voltage and an output voltage. The serially connected diodes limit the output voltage to a determined level of the input voltage by proper choice of the number and type diodes and their polarity arrangements and biasing. A small forward bias present at the output side of the last serially connected diode and to one side of another diode connected to a fixed potential insures a firm "off" voltage, free of noise, at the output.

BACKGROUND OF THE INVENTION

This invention is in the field of logic circuits and is, in particular, a logic noise suppressor circuit.

SUMMARY OF THE INVENTION

The logic noise suppressor of the present invention includes two diodes connected between an input terminal and an output terminal. A first source of bias voltage is connected between the two diodes, forward biasing the first diode to ground and reverse biasing the second diode. A second source of bias voltage, equal to the first bias voltage, is connected to the output terminal of the second diode biasing the second diode to cutoff. The second source of bias voltage further forward biases a third diode to ground and holds a small voltage at the output terminal equal to the forward breakdown voltage of the diode. This forward breakdown voltage of the diode insures a firm "off" voltage at the output terminal, free of noise. Upon application of a trigger signal at the input terminal, the two diodes connected between the input and output terminals are forward biased into conduction. The voltage at the output terminal is clamped to a threshold level of the trigger signal at the input terminal by proper choice of the number and type diodes serially connected between the input and output terminals.

A modification of the invention is the above circuit but with the first diode replaced by a Zener diode in reverse polarity. The bias across the Zener diode is near the Zener breakdown voltage when only noise voltage is present at the input terminal. When the trigger signal is applied at the input terminal the Zener diode will breakdown and reverse conduction will occur.

An object of this invention is to provide a circuit for isolating an output voltage from an input voltage at a desired threshold.

Another object of the present invention is to provide a logic circuit with a firm "off" voltage that is free of noise.

Still another object of the present invention is to provide a novel peak detector circuit.

The foregoing features and objects of this invention may become more apparent by reference to the following description of the preferred embodiment when read in connection with the accompanying description of the drawing.

DESCRIPTION OF THE PREFERRED EMBODIMENT

Figure 1:
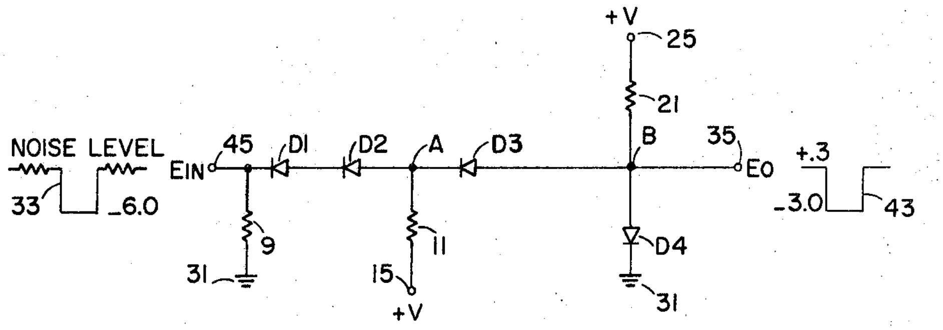
FIG. 1 is a schematic circuit diagram of the preferred embodiment of the invention.

Referring now to FIG. 1, a logic noise suppressor circuit of the present invention is shown with an input wave 33 shown at input terminal 45. Noise voltage is shown when input wave 33 is not pulsed. When the noise voltage is the only voltage present at input terminal 45 there will be no conduction through the logic noise suppressor network because diode D3 is biased to cutoff. If a negative pulse 33 is applied to input terminal 45, diodes D1 and D2 are forward biased by the pulse and a positive source voltage V at terminal 15. Conduction now takes place from the positive voltage source V at terminal 15, through resistor 11, diodes D2 and D1 and resistor 9 to ground 31. This conduction causes a voltage drop at point A, forward biasing diode D3 into conduction. Conduction now takes place from the positive voltage source V at terminal 25, through resistor 21, diodes D3, D2 and D1 and through resistor 9 to ground. Diode D4 is reversed biased by the negative voltage now present at point B, and no current will flow through diode D4 to ground. It can readily be seen that the threshold voltage at output 35 is limited by the voltage drops across diodes D1, D2 and D3 in series with input wave 33 at input terminal 45. For the voltage range below the threshold voltage, the voltage at output terminal 35 appears as a linear function of the input wave 33 at input terminal 45, minus the voltage drops across diodes D1, D2 and D3.

Figure 2:
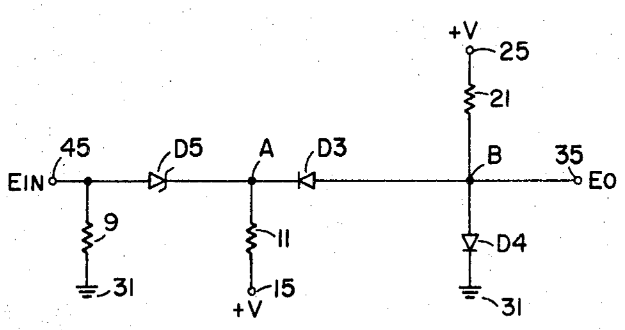
FIG. 2 is an alternate embodiment of the invention.

FIG. 2 illustrates a slight variation of the same logic noise suppressor of FIG. 1 with diodes D1 and D2 replaced by reverse-biased Zener diode D5. The bias across D5 is sufficient to bias D5 near its Zener breakdown voltage. If the negative pulse of input wave 33 is applied to input terminal 45, Zener diode D5 will break down and reverse conduction will occur. The conduction path is the same as with the serially connected diodes resulting in a sudden voltage drop at point A. Conduction is from positive voltage source V at terminal 25, through resistor 21, diodes D3 and D5 and through resistor 9 to ground 31.

Figure 3:
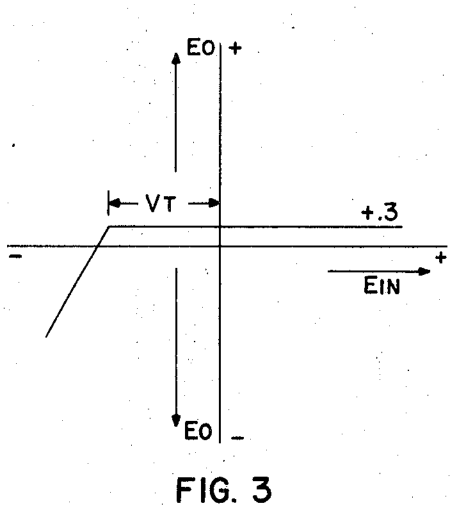
FIG. 3 is a waveform of the approximate transfer function of the logic noise suppressor circuit.

FIG. 3 illustrates the approximate transfer function of the logic noise suppressor circuit. The ordinate axis represents the output voltage at terminal 35 and the abscissa axis represents the input voltage at input terminal 45. The small positive voltage, represented as +.3 volt, is established at point B when the noise voltage only is present at input terminal 45, and is the voltage drop across diode D4 to ground. This small positive voltage insures a firm "off" voltage for a PNP logic inverter at terminal 35. The abscissa $V_T$ represents the threshold voltage at terminal 35, and its value is a function of the number and type of diodes utilized in the circuit.

While a specific embodiment of the invention has been shown and described, other embodiments may be obvious to one skilled in the art, in light of this disclosure.

I claim:

1. A logic noise suppressor circuit for suppressing noise voltage in an electrical signal, including a first diode having a cathode and an anode; a first resistor, said first resistor connected between said cathode and ground, with said signal applied to the connection of said first resistor and said cathode; a first positive biasing means connected to said anode; a second diode having a cathode and an anode, said first biasing means connected to the cathode of said second diode, with the anode of said second diode coupled to an output terminal; a third diode having a cathode and an anode, with the cathode of said third diode connected to ground and the anode of said third diode connected to said output terminal; and a second positive biasing means connected to said output terminal to establish a forward bias for said second diode and said third diode for establishing a firm "off" voltage to logic circuits connected to said output terminal when only noise voltage is present at said junction of said first resistor and said cathode.

References Cited

UNITED STATES PATENTS

| | | | |
|---|---|---|---|
| Re. 25,867 | 9/1965 | Richards | 307—237 XR |
| 3,248,658 | 4/1966 | Brown | 328—165 |
| 3,422,282 | 1/1969 | Orrell | 307—237 XR |

STANLEY T. KRAWCZEWICZ, Primary Examiner

U.S. Cl. X.R.

307—317, 318; 328—165